United States Patent
Visweswariah et al.

(10) Patent No.: US 8,359,565 B2
(45) Date of Patent: Jan. 22, 2013

(54) METHOD AND APPARATUS FOR GENERATING TEST PATTERNS FOR USE IN AT-SPEED TESTING

(75) Inventors: Chandramouli Visweswariah, Croton-on-Hudson, NY (US); Jinjun Xiong, White Plains, NY (US); Vladimir Zolotov, Putnum Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/439,188

(22) Filed: Apr. 4, 2012

(65) Prior Publication Data

US 2012/0191401 A1    Jul. 26, 2012

Related U.S. Application Data

(63) Continuation of application No. 12/464,025, filed on May 11, 2009, now Pat. No. 8,176,462.

(51) Int. Cl.
*G06F 17/50* (2006.01)
*G06F 11/22* (2006.01)

(52) U.S. Cl. ........ 716/136; 716/106; 716/108; 716/113; 714/724; 714/738; 714/741

(58) Field of Classification Search ............ 716/106, 716/108, 113, 126, 111, 136; 714/724, 738, 714/741
See application file for complete search history.

(56) References Cited

U.S. PATENT DOCUMENTS

| | | | |
|---|---|---|---|
| 7,116,142 B2 | 10/2006 | Ferraiolo et al. | |
| 7,257,800 B1 | 8/2007 | Singh et al. | |
| 7,478,356 B1 | 1/2009 | Sundararajan et al. | |
| 7,620,921 B2 | 11/2009 | Foreman et al. | |
| 7,647,573 B2 * | 1/2010 | Abadir et al. | 716/113 |
| 7,886,247 B2 | 2/2011 | Fatemi et al. | |
| 7,971,120 B2 | 6/2011 | Shi et al. | |
| 7,971,169 B1 * | 6/2011 | Tetelbaum et al. | 716/113 |
| 8,176,462 B2 | 5/2012 | Visweswariah et al. | |
| 2003/0188246 A1 * | 10/2003 | Rearick et al. | 714/738 |
| 2005/0065765 A1 | 3/2005 | Visweswariah | |
| 2007/0074135 A1 | 3/2007 | Craig et al. | |
| 2007/0288822 A1 * | 12/2007 | Lin et al. | 714/741 |
| 2008/0183731 A1 | 7/2008 | Gilbert | |
| 2008/0209292 A1 | 8/2008 | Yokota | |

(Continued)

OTHER PUBLICATIONS

"Variation-Aware Performance Verification Using At-Speed Structural Test and Statistical Timing", by Vikram Iyengar, Jinjun Xiong, Subbayyan Venkatesan, and Vladimir Zolotov, pp. 405-412, @2007 by IEEE.*

(Continued)

*Primary Examiner* — Nha Nguyen
(74) *Attorney, Agent, or Firm* — Preston J. Young

(57) ABSTRACT

In one embodiment, the invention is a method and apparatus generating test patterns for use in at-speed testing. One embodiment of a method for use by a general purpose computing device that is configured to generate a set of test patterns with which to test an integrated circuit chip includes receiving, by an input device of the general purpose computing device, statistical timing information relating to the integrated circuit chip and a logic circuit of the integrated circuit chip and generating, by a processor of the general purpose computing device, the set of test patterns in accordance with the statistical timing information while simultaneously selecting a set of paths on which to test the set of test patterns.

16 Claims, 6 Drawing Sheets

U.S. PATENT DOCUMENTS

| | | |
|---|---|---|
| 2008/0270953 A1 | 10/2008 | Foreman et al. |
| 2009/0037854 A1* | 2/2009 | Bittlestone et al. ............... 716/4 |
| 2009/0100393 A1 | 4/2009 | Visweswariah et al. |
| 2009/0112344 A1 | 4/2009 | Nackaerts et al. |
| 2009/0115469 A1 | 5/2009 | Cortadella et al. |
| 2009/0119629 A1 | 5/2009 | Grise et al. |
| 2009/0132976 A1 | 5/2009 | Desineni et al. |
| 2009/0271751 A1 | 10/2009 | Fatemi et al. |
| 2010/0162064 A1 | 6/2010 | Shi et al. |

OTHER PUBLICATIONS

Jess et al.; "Statistical Timing for Parametric Yield Prediction of Digital Integrated Circuits"; DAC 2003, Jun. 2-6, 2003, Anaheim, California, USA, Copyright 2003 ACM 1-58113-688 9/03/001 pp. 932-937 alternately known as IEEE: vol. 25, No. 11; Nov. 2006; pp. 2376-2392.

* cited by examiner

METHOD AND APPARATUS FOR GENERATING TEST PATTERNS FOR USE IN AT-SPEED TESTING

CROSS REFERENCE TO RELATED APPLICATIONS

This application is a continuation of co-pending U.S. patent application Ser. No. 12/464,025, filed May 11, 2009, which is herein incorporated by reference in its entirety.

BACKGROUND OF THE INVENTION

The present invention relates generally to design automation, and relates more particularly to automatic test pattern generation (ATPG) for detecting process variation delay defects in integrated circuit (IC) chips.

When IC chips come off the manufacturing line, the chips are tested "at-speed" to ensure that they perform correctly (and to filter out chips that do not perform correctly). In particular, a set of paths is selected, and the set of paths is then tested for each chip in order to identify the chips in which one or more of the selected paths fail timing requirements. Selection of these paths is complicated by the presence of process variations. Because of these variations, different paths can be critical in different chips. That is, a path that is critical in one chip may not be critical in another chip, and vice versa. As such, selection of the paths that have a higher probability of being critical is typically a goal.

Once these paths are selected, they are sensitized by a test pattern generation tool. Unfortunately, many paths are not capable of being tested because they are either not sensitizable at all or not sensitizable within a relatively reasonable period of time. In fact, studies have shown that up to eighty-one percent of path delay faults in ISCAS-85 benchmark circuits cannot be sensitized. Thus, much time and computational resources may be wasted in the generation of paths that are later rejected because they cannot be sensitized. Moreover, the quality of the test is significantly reduced due to rejection of the paths that cannot be sensitized.

SUMMARY OF THE INVENTION

In one embodiment, the invention is a method and apparatus generating test patterns for use in at-speed testing. One embodiment of a method for use by a general purpose computing device that is configured to generate a set of test patterns with which to test an integrated circuit chip includes receiving, by an input device of the general purpose computing device, statistical timing information relating to the integrated circuit chip and a logic circuit of the integrated circuit chip and generating, by a processor of the general purpose computing device, the set of test patterns in accordance with the statistical timing information while simultaneously selecting a set of paths on which to test the set of test patterns.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for generating test patterns for use in at-speed testing of IC chips. Embodiments of the invention compute test patterns simultaneously with the selection of tested paths. Any time that either a partially constructed path is not promising for testing process variation delay defects or is not sensitizable, further traversal of the path is halted, and analysis of the entire logic cone feeding the path is skipped. The present invention therefore allows unsensitizable paths to be discovered during the early stages of the test pattern generation process. This not only substantially guarantees process space coverage, but it also reduces the search space and improves computational efficiency by reducing the amount of computation spent considering fruitless paths.

Figure 1:
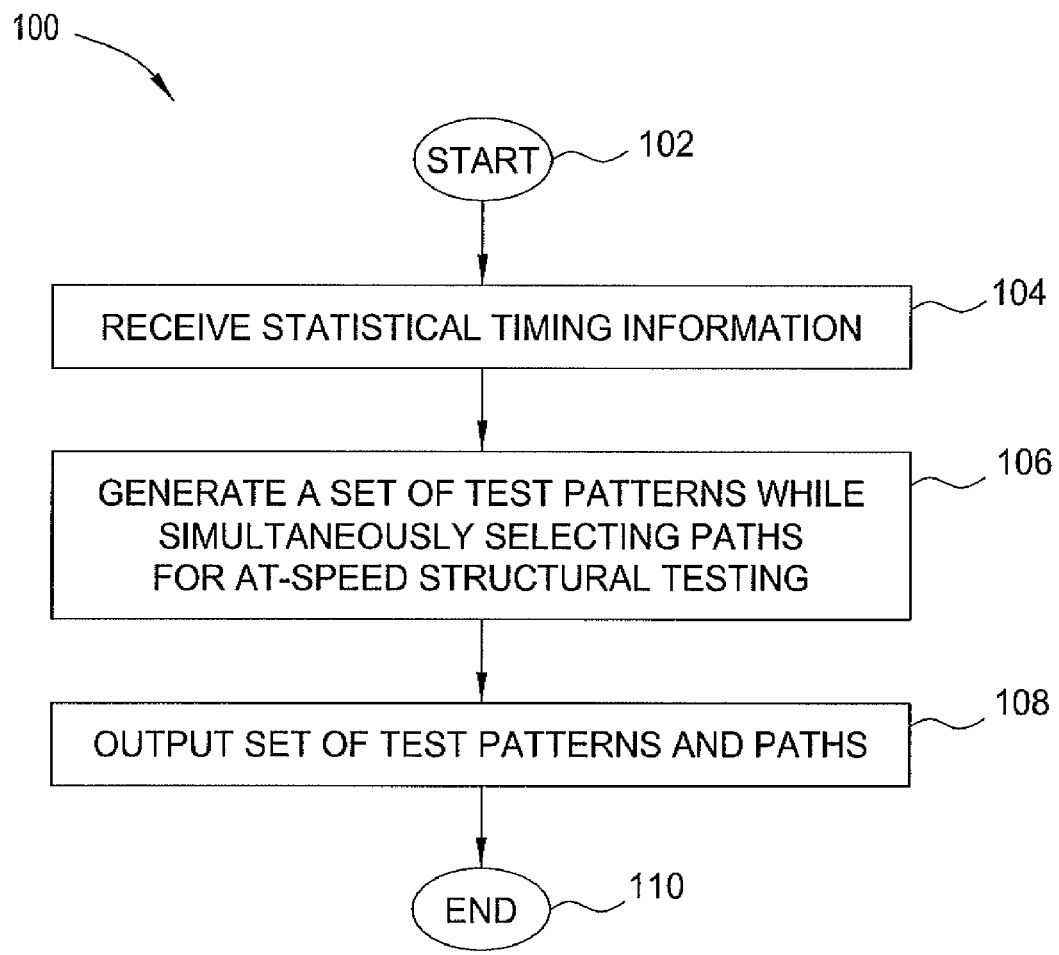
FIG. 1 is a flow diagram illustrating one embodiment of a method for generating a set of test patterns and paths for testing an IC chip, according to the present invention.

FIG. 1 is a flow diagram illustrating one embodiment of a method 100 for generating a set of test patterns and paths for testing an IC chip, according to the present invention. The method 100 may be implemented, for example, in one or more tools that are used in the at-speed structural testing (ASST) process.

The method 100 is initialized at step 102 and proceeds to step 104, where the method 100 receives statistical timing information for the IC chip, for example as computed by a statistical timings analysis tool. In one embodiment, the statistical timing information received in step 104 includes arrival times (ATs), required arrival times (RATs), delays, and slacks (i.e., how much earlier than required a signal arrives) of each node in the IC chip.

In step 106, the method 100 uses this statistical timing information to generate a set of test patterns while simultaneously selecting paths for testing in the ASST process. In one embodiment, the paths that are selected are sensitized during the selection process. In one embodiment, sensitization of a path in accordance with step 106 involves combining the logical representation of the circuit with the circuit's timing graph. One embodiment of a method for generating the test patterns while selecting the paths is discussed in greater detail with respect to FIGS. 2-5.

In step 108, the method 100 outputs the set of test patterns and the selected paths. In one embodiment, the set of test patterns and the selected paths are output to an ASST tool that performs the testing of IC chips. The method 100 then terminates in step 110.

Thus, the method 100 tightly integrates path selection and path sensitization. As a result, unnecessary work for unsensitizable paths can be substantially minimized later in the testing process. Moreover, by sensitizing the paths during path traversal, process space coverage can be virtually guaranteed, and optimal tests can be created.

Figure 2:
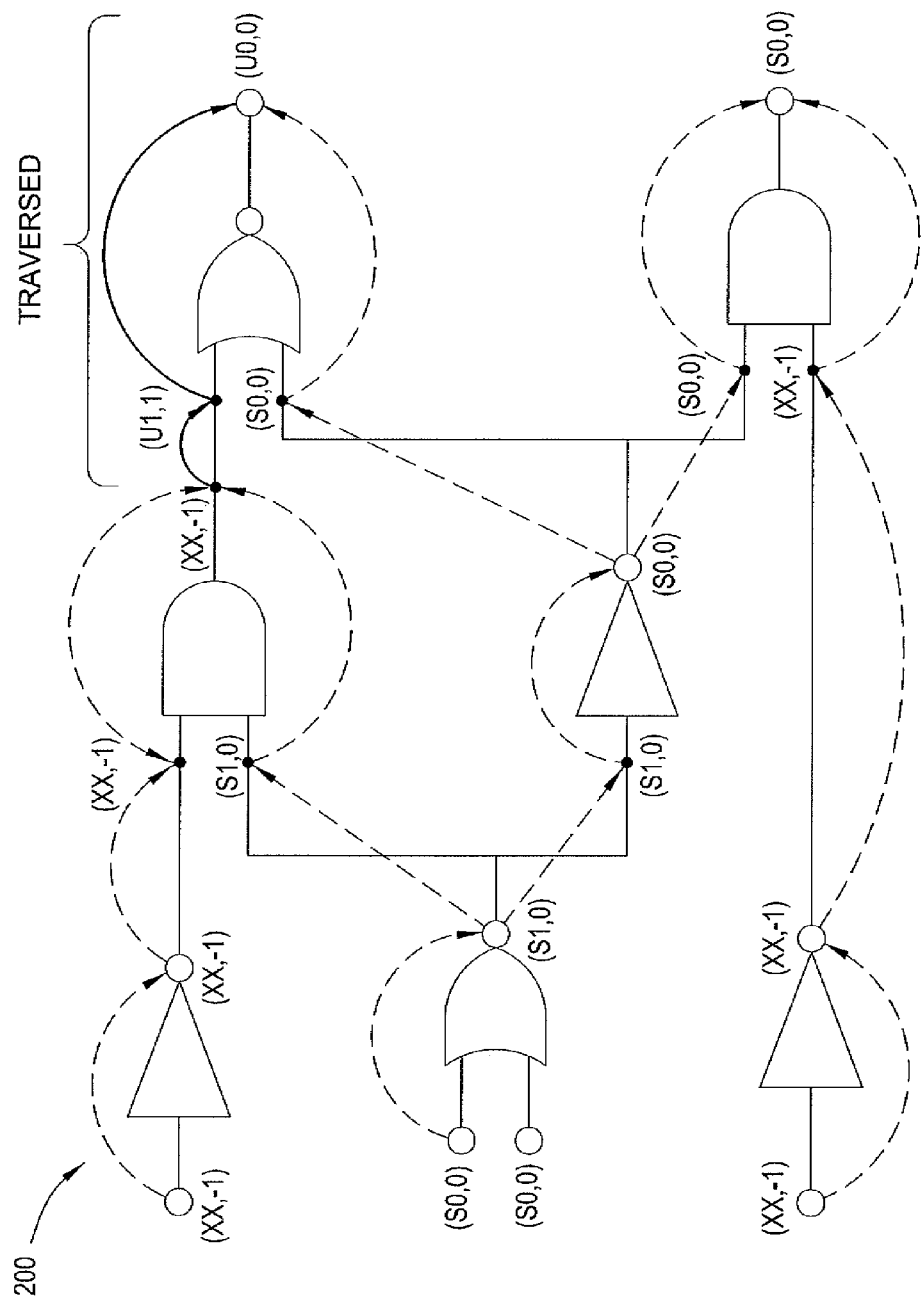
FIG. 2 is a diagram illustrating a logical representation of an exemplary circuit combined with the exemplary circuit's timing graph.

FIG. 2 is a diagram illustrating a logical representation 200 of an exemplary circuit combined with the exemplary circuit's timing graph (illustrated as dashed lines). Edges in FIG. 2 model signal propagation through logic gates and interconnects. Nodes in FIG. 2 are annotated with their statistical arrival times and required arrival times (in parentheses), while edges are annotated with their statistical delays (also in parentheses). This data is used for computing a test quality metric and its bounds for individual paths and/or sets of paths, for example as described by Zolotov et al. in "Statistical Path Selection for At-Speed Test," ICCAD, November 2008, San Jose, Calif. and in U.S. patent application Ser. No. 12/111,634, filed Apr. 29, 2008, both of which are herein incorporated by reference in their entireties. The branch-and-bound techniques described in these references use these bounds to decide which paths to traverse.

In one embodiment, sensitization of a path is performed by computing a pair of input vectors that produces required transitions along the path and allows detection of path delay faults. In one embodiment, signal values and transitions are represented using multi-valued algebra. For instance, in the example illustrated in FIG. 2, the well-known five-value logic system $\Sigma=\{S0, S1, U0, U1, XX\}$ is used, where S0 and S1 represent, respectively, stable 0 and stable 1; U0 and U1 represent, respectively, $1 \rightarrow 0$ and $0 \rightarrow 1$ transitions for path nodes or signals with a final state of 0 or 1 for all other nodes; and XX represents signals whose initial and final states are unspecified. A path sensitization technique assigns to circuit nodes the pair $(Y_{j,i}, l_j)$, where $Y_{j,i} \epsilon \Sigma$ is the signal required for sensitization of the path node $N_j$, and $l_j$ is the path level of the path node $N_1$. The path level is used to clean up any sensitization assignments for backtracking when either sensitization is not possible or when the bounds of the test quality metric indicate that any path going through the current sub-path cannot sufficiently improve the quality of the test.

Figure 3:
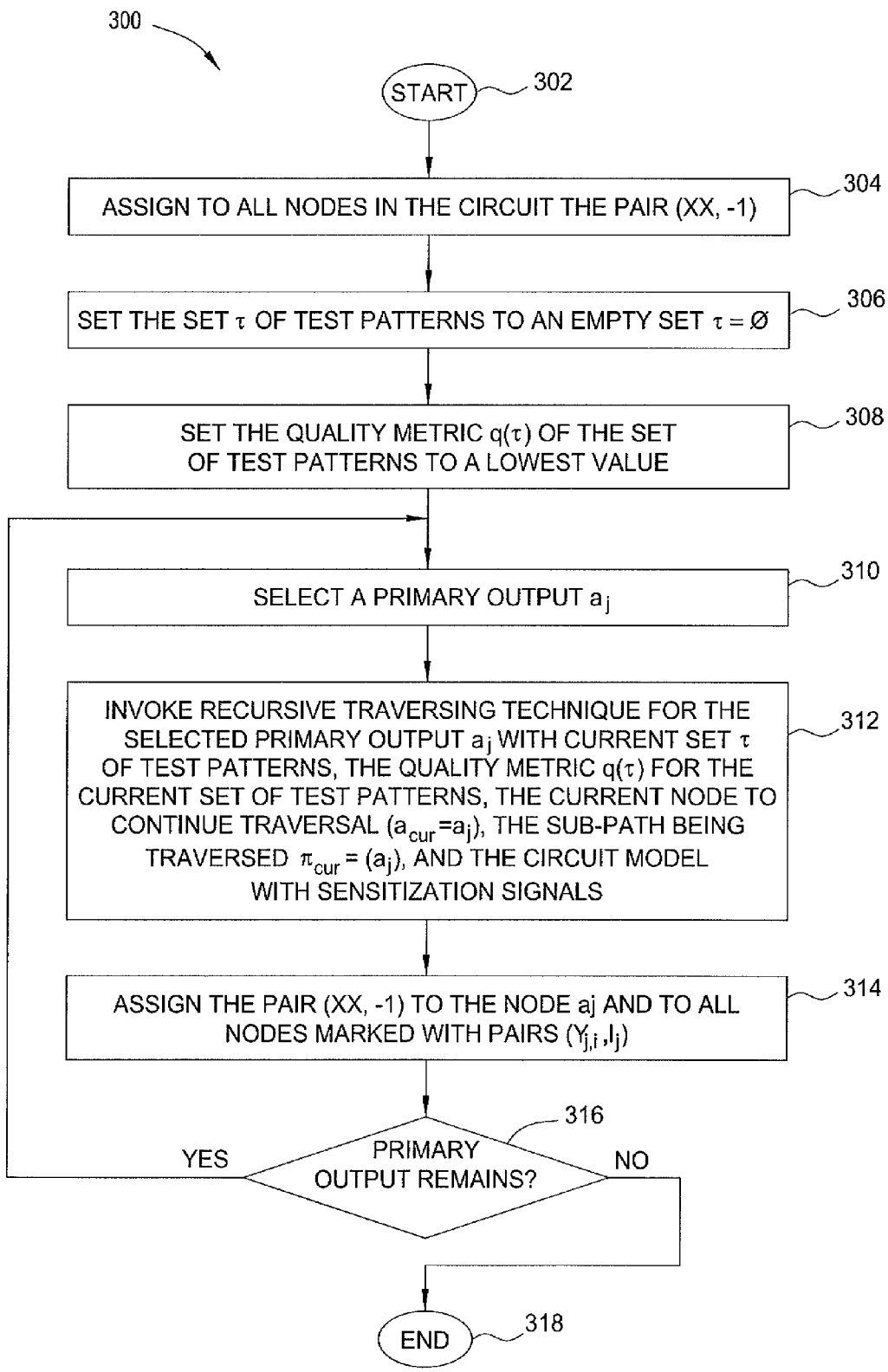
FIG. 3 is a flow diagram illustrating one embodiment of a method for generating test patterns, according to the present invention.

FIG. 3 is a flow diagram illustrating one embodiment of a method 300 for generating test patterns, according to the present invention. The method 300 may be implemented, for example, in one or more tools that are used in the at-speed structural testing (ASST) process. More specifically, the method 300 may be implemented in accordance with step 106 of the method 100 in order to generate test patterns while selecting paths for testing.

The method 300 is initialized at step 302 and proceeds to step 304, where the method 300 assigns, to all nodes in a given circuit, the pair (XX, −1). This can be observed, for example, at several of the nodes illustrated in FIG. 2.

In step 306, the method 300 sets the set $\tau$ of test patterns to an empty set (i.e., $\tau=\emptyset$). The method 300 then proceeds to step 308 and sets the current test quality metric $q(\tau)$ of the set of test patterns to a lowest value (e.g., to zero).

In step 310, the method 300 selects a primary output $a_j$ of the circuit. The method 300 then proceeds to step 312 and invokes a recursive traversing technique for the selected primary output. One embodiment of a method for recursive traversal that may be invoked in accordance with step 312 is discussed in further detail with respect to FIGS. 4A-4B. In one embodiment, the recursive traversing technique is initialized with a set of parameters, including: (1) the current set $\tau$ of test patterns and the associated test quality metric $q(\tau)$; (2) the current node $a_{cur}$ to continue traversal (i.e., the selected primary output $a_j$, such that $a_{cur}=a_j$); (3) the sub-path being traversed $\pi_{cur}=(a_j)$ (upon the first iteration of the method 300, the sub-path includes only one node, namely, the selected primary output $a_j$ (which is also current node $a_{cur}$)); and (4) the logical circuit model with sensitization signals (e.g., as illustrated in FIG. 2).

In step 314, the method 300 assigns the pair (XX, −1) to the node $a_j$ and to all nodes marked with the pair of input vectors $(Y_{j,i}, l_j)$. In this case, $l_j$ is the distance of the node $a_j$ from the path output. This cleans all of the sensitization information written into the circuit by the recursive traversing technique invoked in step 312.

In step 316, the method 300 determines whether there are any primary outputs remaining to be examined (e.g., in accordance with steps 312-314). If the method 300 concludes in step 316 that there are no primary outputs remaining to be examined, the method 300 terminates in step 318. Alternatively, if the method 300 concludes in step 316 that there are primary outputs remaining to be examined, the method 300 returns to step 310 and proceeds as described above to process the next primary output.

Figure 4A:
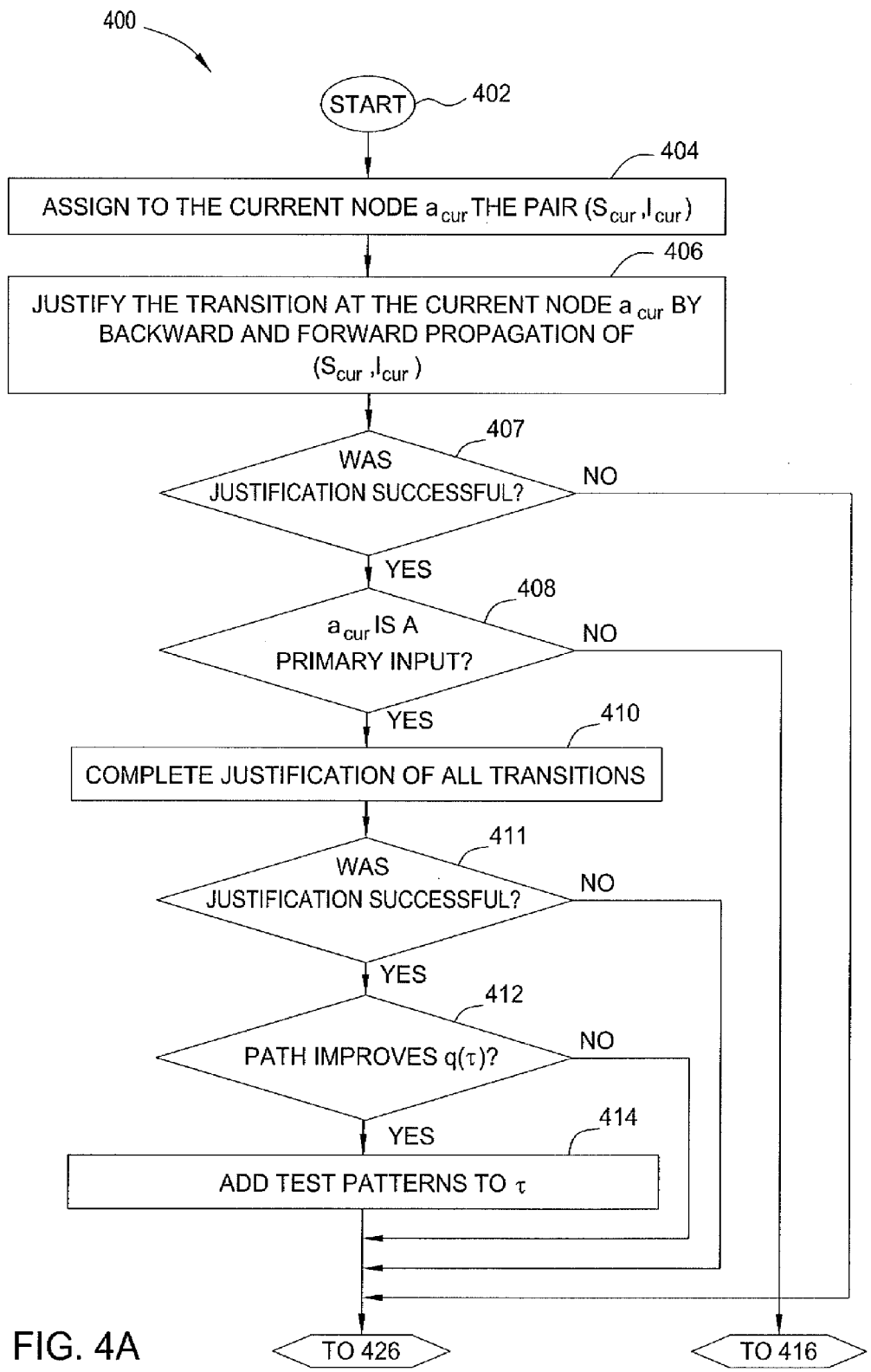
FIGS. 4A-4B comprise a flow diagram illustrating one embodiment of a method for recursively traversing a set of paths for potential testing, according to embodiments of the present invention.
Figure 4B:
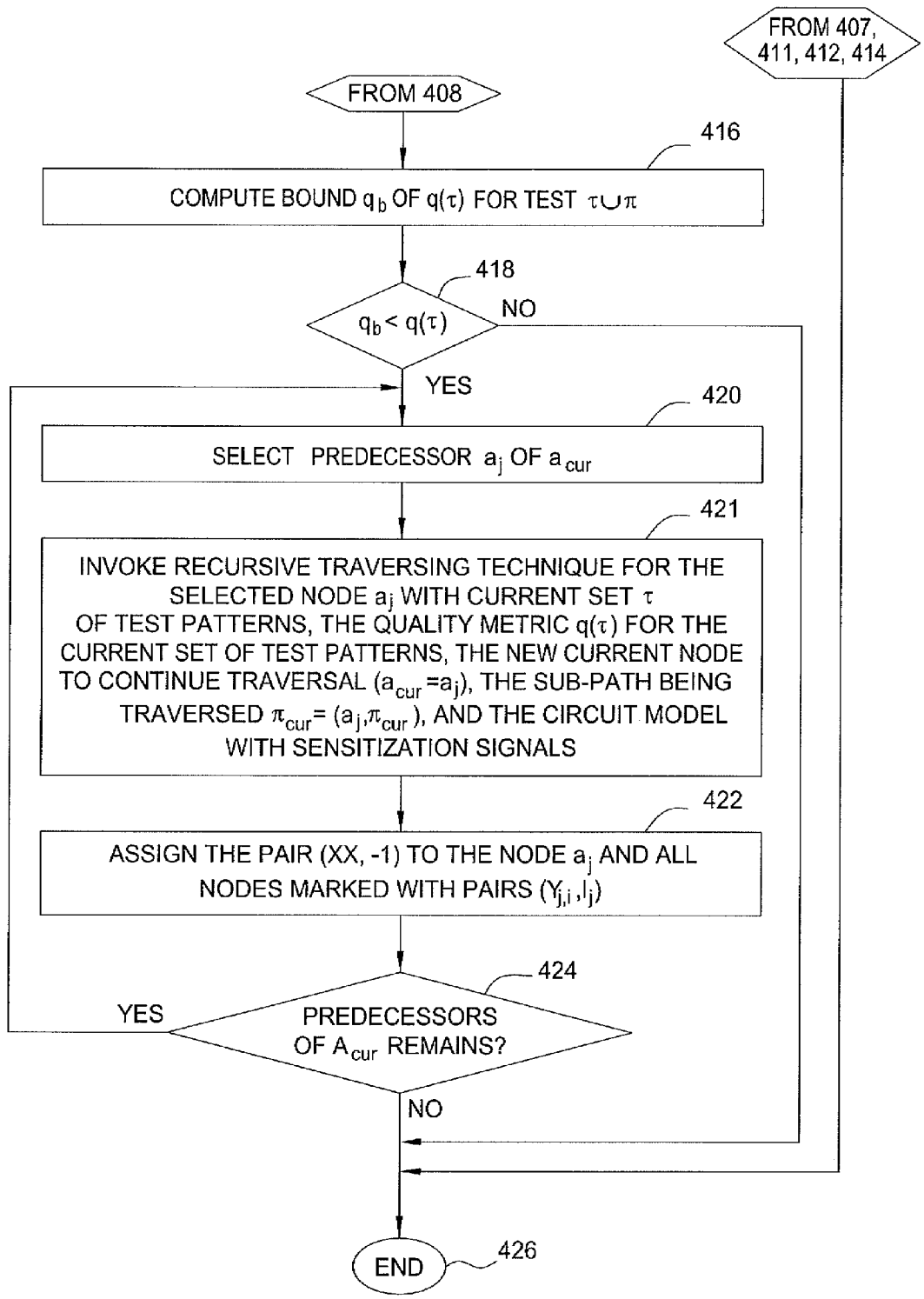

FIGS. 4A-4B comprise a flow diagram illustrating one embodiment of a method 400 for recursively traversing a set of paths for potential testing, according to embodiments of the present invention. The method 400 may be implemented, for example, in one or more tools that are used in the at-speed structural testing (ASST) process. More specifically, the method 400 may be implemented in accordance with step 312 of the method 300 in order to generate test patterns while selecting paths for testing.

The method 400 is initialized at step 402 and proceeds to step 404, where the method 400 assigns to the current node $a_{cur}$ the pair $(S_{cur}, l_{cur})$, where $S_{cur} \epsilon \Sigma$ is the required transition and $l_{cur}$ is the length of the sub-path $\pi_{cur}$ (i.e., the distance of the current node $a_{cur}$ from the path output).

In step 406, the method 400 justifies the transition at the current node $a_{cur}$ by backward and forward propagation of the pair of $(S_{cur}, l_{cur})$. In one embodiment the signal part $S_{cur}$ the pair is propagated according to the rules of the five-value logic system, discussed above. The number part $l_{cur}$ of the pair is propagated without any changes. In one embodiment, only unambiguous assignments are performed. In step 407, the method 400 determines whether the justification in step 406 was successful (i.e., whether justification was possible). If the method 400 concludes in step 407 that justification was not successful, the method 400 terminates in step 426.

Alternatively, if the method 400 concludes in step 407 that justification was successful, the method 400 proceeds to step 408, where the method 400 determines whether the current node $a_{cur}$ is a primary input for the circuit. If the method 400 concludes in step 408 that the current node $a_{cur}$ is a primary input, the method 400 proceeds to step 410 and completes the justification of all of the transitions. In one embodiment, justification of the transitions is accomplished by assigning pairs $(Y_{cur,i}, l_{cur})$, where $Y_{cur,i} \epsilon \Sigma$ is the required transition and $l_{cur}$ is the length of the path. Alternatively, if the method 400 concludes in step 408 that the current node $a_{cur}$ is not a primary input, the method 400 proceeds to step 416, discussed in further detail below.

In step 411, the method 400 determines whether the justification performed in step 410 was successful (i.e., whether justification was possible). If the method 400 concludes in step 411 that justification was not successful, the method 400 terminates in step 426.

Alternatively, if the method 400 concludes in step 411 that justification was successful, the method 400 proceeds to step 408, where the method 400 determines whether the test quality of the path constructed in accordance with step 410 improves the test quality metric $q(\tau)$ of the set $\tau$ of test patterns. If the method 400 concludes in step 412 that the path constructed in accordance with step 410 does improve the test quality metric q(τ) of the set τ of test patterns, then the method 400 proceeds to step 414 and constructs the pair of input vectors corresponding to the assigned signals $Y_{cur,i}$ and adds this pair of input vectors to the set of test patterns. In one embodiment, the constructed pair of input vectors is added to the set τ of test patterns only if it is not redundant (in terms of coverage of the process variation space) with respect to any of the test patterns already contained in the set τ. Once the constructed pair of input vectors is added to the set τ of test patterns, the method 400 terminates in step 426.

Alternatively, if the method 400 concludes in step 412 that the path constructed in accordance with step 410 does not improve the test quality metric q(τ) of the set τ of test patterns, the method 400 terminates in step 426.

In step 416, the method 400 computes the bound $q_b$ of the test quality metric q(τ) for the test pattern τ∪π, where π is any path going through the traversed sub-path $\pi_{cur}$. The method 400 then determines in step 418 whether the bound $q_b$ is greater than the test quality metric q(τ). If the method 400 concludes in step 418 that the bound $q_b$ is not greater than the test quality metric q(τ), then the method 400 terminates in step 426.

Alternatively, if the method 400 concludes in step 418 that the bound $q_b$ is greater than the test quality metric q(τ), then the method 400 proceeds to step 420 and selects the predecessor $a_j$ of the current node $a_{cur}$.

The method 400 then proceeds to step 421 and invokes the recursive traversing technique of steps 402-418 for the selected predecessor $a_j$ of the current node $a_{cur}$. In this case, the recursive traversing technique is invoked with a set of parameters, including: (1) the current set τ of test patterns and the associated test quality metric q(τ); (2) the new current node $a_j$ to continue traversal (i.e., the selected predecessor of the old current node $a_{cur}$); (3) the sub-path being traversed $\pi_{cur}=(a_j,\pi_{cur})$ (the sub-path is now extended with the selected node $a_j$); and (4) the logical circuit model with sensitization signals (e.g., as illustrated in FIG. 2).

In step 422, the method 400 assigns the pair (XX, −1) to the node $a_j$ and to all nodes marked with the pair of input vectors $(Y_{j,i},1_j)$ In this case, i is the distance of the current node $a_j$ from the path output. This cleans all of the sensitization information written into the circuit by the recursive traversing technique invoked in step 421.

In step 424, the method 400 determines whether there are any predecessors of the old current node $a_{cur}$ remaining to be examined. If the method 400 concludes in step 424 that there are predecessors of the old current node $a_{cur}$ remaining to be examined, the method 400 proceeds to step 420 and selects another predecessor for processing. The method 400 then proceeds as described above.

Alternatively, if the method 400 concludes in step 424 that there are no predecessors of the old current node $a_{cur}$ remaining to be examined, the method 400 terminates in step 426. In one embodiment, termination in accordance with step 426 involves returning to the step at which the recursive traversing technique was invoked (e.g., step 312 of the method 300 or step 421 of the method 400).

Referring back to FIG. 2, which illustrates the state of the exemplary circuit's logical model during traversal, the heavy black lines show a partially traced path segment traversed in accordance with the methods 300 and 400.

This, in sum, each potential path is traversed in a manner similar to the branch-and-bound algorithm described by Fatemi et al., supra. When each node in the path is traversed, the node is set to the required transition. If the node is a gate input, the other gate inputs are set to the values required for sensitization of the path. These values are justified by backward propagation, and, if they are not justifiable, traversal returns to the most recent branch point.

If the node is a branch point, the metric bounds of each possible branch are computed. The most promising branch is selected, and the recursive traversal technique described above is implemented to traverse the path. If no branch appears promising, then traversal returns to the most recent (previous) branch point.

If the node is an end point, the traversed path is accepted as a path for testing, unless the path does not improve coverage of the process space. For instance, if the path is redundant with respect to another path in the accumulated set of test paths, the path will be removed. Once the path has been added to the set of test paths, traversal returns to the most recent branch point.

In a further embodiment, of the invention, a path that is being considered for addition to the accumulated set of test paths may be filtered or removed based on robustness. Specifically, embodiments of the invention build a set of sensitizable test paths that include only robust paths that cover as much of the process space as possible. In an alternative embodiment, paths that are sensitizable but not robust may be stored for use as a backup. These backup paths may cover process space that is not covered by the robust paths.

Figure 5:
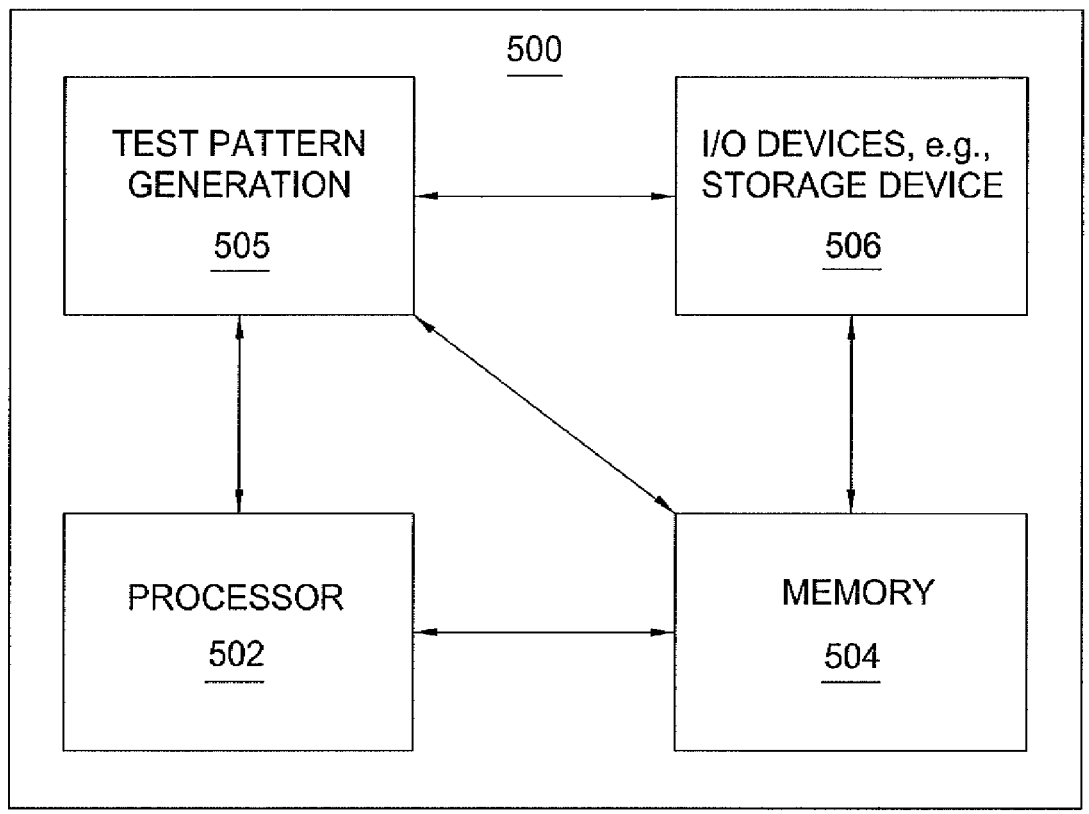
FIG. 5 is a high-level block diagram of the test pattern generation method that is implemented using a general purpose computing device.

FIG. 5 is a high-level block diagram of the test pattern generation method that is implemented using a general purpose computing device 500. In one embodiment, a general purpose computing device 500 comprises a processor 502, a memory 504, a test pattern generation module 505 and various input/output (I/O) devices 506 such as a display, a keyboard, a mouse, a stylus, a wireless network access card, and the like. In one embodiment, at least one I/O device is a storage device (e.g., a disk drive, an optical disk drive, a floppy disk drive, a path selection tool, and/or a test pattern generation tool). It should be understood that the test pattern generation module 505 can be implemented as a physical device or subsystem that is coupled to a processor through a communication channel.

Alternatively, the test pattern generation module 505 can be represented by one or more software applications (or even a combination of software and hardware, e.g., using Application Specific Integrated Circuits (ASIC)), where the software is loaded from a storage medium (e.g., I/O devices 506) and operated by the processor 502 in the memory 504 of the general purpose computing device 500. Thus, in one embodiment, the test pattern generation module 505 for simultaneously sensitizing paths and generating test patterns for at-speed structural testing of an IC chip, as described herein with reference to the preceding Figures, can be stored on a computer readable storage medium (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for use by a general purpose computing device that is configured to generate a set of test patterns with which to test an integrated circuit chip, the method comprising:
generating, by a processor of the general purpose computing device, the set of test patterns; and
selecting, by the processor of the general purpose computing device, a set of paths on which to test the set of test patterns, wherein the generating and the selecting are performed simultaneously, and wherein the selecting comprises:
sensitizing one or more potential paths for inclusion in the set of paths, wherein the sensitization is performed as the one or more potential paths are traversed, wherein the sensitizing comprises, for each given path in the one or more potential paths:
traversing the given path through a combined graph in order to assess an impact of the given path on the set of test patterns, wherein the combined graph merges a logical representation of the integrated circuit chip with a timing graph for the integrated circuit chip,
wherein the traversing comprises:
setting, at each node of the given path, a required transition;
justifying values of the required transition by propagating the values forward and backward along circuits of the integrated circuit chip;
and when the justifying is successful, computing a pair of input vectors corresponding to the required transition, and adding the pair of input vectors to the set of test patterns; and
wherein the setting comprises computing a pair comprising: a signal that produces the required transition along at least one of the one or more potential paths; and a distance between a current node of the given path and an output of the given path.

2. The method of claim 1, wherein the traversing further comprises:
determining that the current node of the given path is a branch point for the given path, such that two or more sub-paths propagate from the current node; and
propagating values of the required transition at the current node backward along a selected one of the two or more sub-paths that appears most promising.

3. The method of claim 2, further comprising:
performing said determining and propagating at a previous branch point in the given path, when none of the two or more sub-paths propagating from the current node appear promising.

4. The method of claim 3, wherein the performing said determining and propagating at a previous branch point removes sensitization information previously set for sensitizing a part of the given path between the current node and the previous branch point.

5. The method of claim 4, wherein the sensitization information that is removed is determined using a unique identifier that represents the distance between the current node of the given path and the output of the given path.

6. The method of claim 5, wherein pairs in the sensitization information that have a unique identifier matching a unique identifier of the current node.

7. The method of claim 3, wherein the traversing comprises:
determining that a current node of the given path is an endpoint for the given path; and
adding the given path to the set of paths.

8. The method of claim 7, further comprising:
filtering the given path in accordance with one or more criteria prior to adding the given path to the set of paths.

9. The method of claim 8, wherein the filtering comprises:
removing the given path from the set of paths when addition of the given path to the set of paths does not improve coverage of the integrated circuit chip.

10. The method of claim 1, wherein the logical representation comprises:
a plurality of nodes, where each of the plurality of nodes represents one of a plurality of logic gates of the integrated circuit chip; and
a plurality of edges connecting the plurality of nodes, where each of the plurality of edges represents a propagation of a signal through the plurality of logic gates.

11. The method of claim 10, wherein the merging comprises:
annotating the plurality of nodes with corresponding statistical arrival times and required arrival times; and
annotating the plurality of edges with corresponding statistical delays.

12. A computer readable storage medium containing an executable program for generating a set of test patterns with which to test an integrated circuit chip, where the program performs the steps of:
generating, by a processor of the general purpose computing device, the set of test patterns, wherein the generating comprises:
obtaining a logical representation of the integrated circuit chip;
obtaining a timing graph for the integrated circuit chip; and
merging the logical representation with the timing graph to form a combined graph; and
selecting, by the processor of the general purpose computing device, a set of paths on which to test the set of test patterns, wherein the generating and the selecting are performed simultaneously, and wherein the selecting comprises:
sensitizing one or more potential paths for inclusion in the set of paths, wherein the sensitization is performed as the one or more potential paths are traversed, wherein the sensitizing comprises, for each given path in the one or more potential paths, traversing the given path through the combined graph in order to assess an impact of the given path on the set of test patterns, wherein the traversing comprises:
setting, at each node of the given path, a required transition;
justifying values of the required transition by propagating the values forward and backward along circuits of the integrated circuit chip;
and when the justifying is successful, computing a pair of input vectors corresponding to the required transition, and adding the pair of input vectors to the set of test patterns;
and wherein the setting comprises computing a pair comprising:
a signal that produces the required transition along at least one of the one or more potential paths; and
a distance between a current node of the given path and an output of the given path.

13. The computer readable storage medium of claim 12, wherein the traversing further comprises:
   determining that the current node of the given path is a branch point for the given path, such that two or more sub-paths propagate from the current node;
   propagating the values backward along a selected one of the two or more sub-paths that appears most promising.

14. The computer readable storage medium of claim 12, wherein the traversing further comprises:
   determining that the current node of the given path is an endpoint for the given path; and
   adding the given path to the set of paths.

15. The computer readable storage medium of claim 14, further comprising:
   filtering the given path in accordance with one or more criteria prior to adding the given path to the set of paths.

16. Apparatus for generating a set of test patterns with which to test an integrated circuit chip, the apparatus comprising:
   a storage medium;
   a processor, executing a program stored on the storage medium, performing:
   generating the set of test patterns; and
   selecting a set of paths on which to test the set of test patterns, wherein the generating and the selecting are performed simultaneously, and wherein the selecting comprises:
   sensitizing one or more potential paths for inclusion in the set of paths, wherein the sensitization is performed as the one or more potential paths are traversed, wherein the sensitizing comprises, for each given path in the one or more potential paths:
   traversing the given path through a combined graph in order to assess an impact of the given path on the set of test patterns, wherein the combined graph merges a logical representation of the integrated circuit chip with a timing graph for the integrated circuit chip,
   wherein the traversing comprises:
   setting, at each node of the given path, a required transition;
   justifying values of the required transition by propagating the values forward and backward along circuits of the integrated circuit chip;
   and when the justifying is successful, computing a pair of input vectors corresponding to the required transition, and adding the pair of input vectors to the set of test patterns;
   and wherein the setting comprises computing a pair comprising: a signal that produces the required transition along at least one of the one or more potential paths; and
   a distance between a current node of the given path and an output of the given path.

* * * * *